United States Patent
Nakayama et al.

(10) Patent No.: US 6,852,362 B2
(45) Date of Patent: Feb. 8, 2005

(54) FILM VAPOR DEPOSITION METHOD

(75) Inventors: Masao Nakayama, Tokyo (JP); Hiromichi Kanazawa, Tokyo (JP)

(73) Assignee: TDK Corporation, Tokyo (JP)

( * ) Notice: Subject to any disclaimer, the term of this patent is extended or adjusted under 35 U.S.C. 154(b) by 130 days.

(21) Appl. No.: 10/324,008

(22) Filed: Dec. 20, 2002

(65) Prior Publication Data

US 2003/0118726 A1 Jun. 26, 2003

(30) Foreign Application Priority Data

Dec. 21, 2001 (JP) ........................................ 2001-389389

(51) Int. Cl.[7] .............................................. C23C 16/00
(52) U.S. Cl. ................. 427/248.1; 427/250; 427/255.7; 427/597
(58) Field of Search ............................ 427/248.1, 250, 427/255.7, 597

(56) References Cited

U.S. PATENT DOCUMENTS

| | | | | |
|---|---|---|---|---|
| 4,780,366 A | * | 10/1988 | Nishimatsu et al. | 428/323 |
| 4,888,211 A | * | 12/1989 | Oka et al. | 427/130 |
| 5,161,233 A | * | 11/1992 | Matsuo et al. | 399/136 |
| 5,496,607 A | * | 3/1996 | Inaba et al. | 428/65.3 |
| 5,731,068 A | * | 3/1998 | Mizunoya et al. | 428/212 |

* cited by examiner

Primary Examiner—Bret Chen
(74) Attorney, Agent, or Firm—Oblon, Spivak, McClelland, Maier & Neustadt, P.C.

(57) ABSTRACT

A method of vapor depositing a film is provided wherein the film is not thermally damaged or broken due to the effects of heat and electrification of the film during the heating of a vapor deposition material. The film can be moved and vapor-deposited stably, and a loss of the film can be decreased as compared to the conventional method. The method forms a thin film on a long film, comprising aromatic polyamide, in vacuum. During the heating of the vapor deposition material, the long film stands still or is moved at a very low speed of 1 m/min or less, wherein a shielding plate is placed between the vapor deposition material and the long film. Once the vapor deposition material is completely molten, a substantial movement of the long film is started. At the same time or thereafter, the shielding plate is removed.

9 Claims, 1 Drawing Sheet

FILM VAPOR DEPOSITION METHOD

BACKGROUND OF THE INVENTION

1. Field of the Invention

The present invention relates to a method of vapor depositing a film. More particularly, the present invention relates to a method of vapor depositing a film in which the film is not thermally damaged or broken by a heat for melting a vapor deposition material in vapor deposition preparation steps, and a loss of the film can be decreased as low as possible in the preparation steps.

2. Description of the Related Art

Vapor deposition techniques are applied to polymer films used in a wide variety of usage such as magnetic tapes for backing up data and recording images, wrapping films, and electrode films.

In the magnetic recording usage, a medium is required to have high density, or a tape should be thin, accompanied by a development of a mass storage but small-sized magnetic recording system. A vapor deposition type magnetic recording medium has advantages in the high density recording as compared with a coating type medium. For example, a magnetic layer of the vapor deposition type medium includes no binder, and therefore is filled to higher degree, whereby saturation magnetization can be increased. Also, the vapor deposition type medium can have thin films, whereby recording demagnetization can be prevented even if a recording is performed at a shorter wavelength.

As the conventional vapor deposition medium, a polymer support film such as polyethylene terephthalate (PET) and polyethylene naphthalate (PEN) is used as a support material on which a film is vapor-deposited, and a ferromagnetic metal such as Co and a Co—Ni alloy forms a magnetic layer on the material to be vapor-deposited. The vapor deposition technique generally utilizes continuous vapor deposition using an electron beam for vaporizing the metal, while the polymer film is moved such that it is held by a cooling drum.

In this case, it is required to preheat (melt) the material to be vapor-deposited and a crucible, in order to vaporize the material to be vapor-deposited continuously and stably upon the vapor deposition. In the preheating, the polymer film can be thermally damaged by radiant heat accompanied by heating a vapor deposition source, which results in a broken film. To overcome the problem, a shielding plate that can be opened and closed is disposed between the material to be vapor-deposited and the polymer film, thereby shielding the heat. Or, the polymer film is held by the cooling drum. However, these measures are not sufficient. Accordingly, while the film is moved at low speed, melting is conducted.

Even if the vapor deposition is performed using the above-mentioned way, a moving part leads a loss upon melting even at low speed. The melting significantly limits an efficient use of the film.

Recent magnetic recording medium is required to have mass storage. A total thickness of the tape is required to be thin in order to lengthen a winding length per a tape. The material having high Young's modulus is getting used as the polymer film since such material can provide strength when the tape becomes thin.

Representative examples of the film having high Young's modulus include aromatic polyamide (aramide) films. When such aramide film is used, heat resistance becomes higher than that of PET or PEN. However, the film is extremely electrified by secondary electrons or recoil electrons produced by irradiating the electron beam to the vapor deposition source. When the film is molten while the film is moved at low speed, the electrified film is unfavorably adhered to the cooling drum, whereby the film is easily broken upon peeling, and the movement becomes unstable.

SUMMARY OF THE INVENTION

An object of the present invention is to provide a method of vapor depositing a film such that the film is not thermally damaged or broken by avoiding effects of heat and electrification by the heating for melting, when a vapor deposition material is molten in vapor deposition preparation steps of a long film, and a loss of the film can be decreased as compared with the conventional method, whereby the film can be moved and vapor-deposited stably.

One aspect of the present invention is a method of vapor depositing a thin film on a long film comprising aromatic polyamide in vacuum, comprising the steps of: standing by or moving the long film at a very low speed of 1 m/min or less while a material to be vapor-deposited is molten under the condition that a shielding plate between the material to be vapor-deposited and the long film is closed, starting substantial movement of the long film after the melting of the material to be vapor-deposited is substantially completed, and at the same time or thereafter opening the shielding plate.

Here, such a point that the melting is substantially completed can be previously obtained by grasping the relation of amount of the material, beam power and beam emission time via pre-experiment.

In the present invention, the material to be vapor-deposited is preferably a ferromagnetic metal material. It is also preferable that an electron beam is used for melting the material to be vapor-deposited.

According to the present invention, the long film comprises the predetermined material, and the vapor deposition is performed in accordance with the predetermined conditions and procedures, whereby the effect of the heat on the film can be decreased as low as possible, an area of the film where the heat affects can be minimized. As a result, the film can be prevented from breaking when it is peeled from the cooling drum, the film can be moved excellently upon the vapor deposition, and the vapor deposition can be performed stably.

DESCRIPTION OF THE PREFERRED EMBODIMENTS

Figure 1:
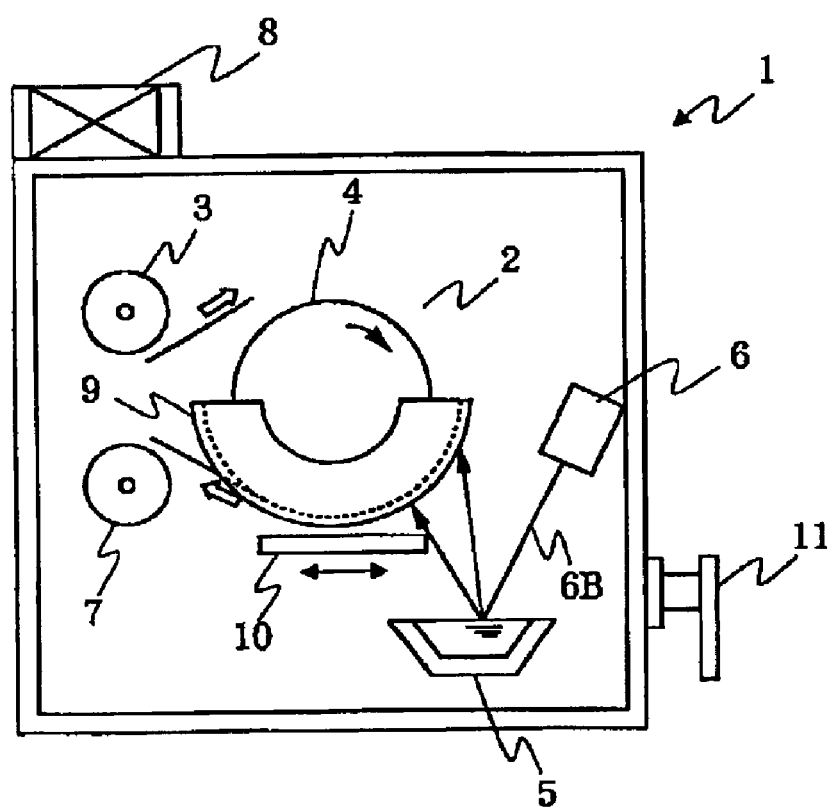
FIG. 1 is a schematic diagram of an oblique vapor deposition apparatus according to the present invention.

Embodiments of the present invention will be described below for detail.

In the vapor deposition method of the present invention, aromatic polyamide having high Young's modulus and excellent heat resistance is used as a polymer support film on which a film is vapor-deposited, and a thin film of a material to be vapor-deposited is formed on the film in vacuum.

FIG. 1 shows an embodiment of the vapor deposition apparatus that can be used in the present invention. A vapor deposition apparatus 1 shown is referred to as an oblique vapor deposition apparatus. In an oblique vapor deposition method using this apparatus, vapor of the material to be vapor-deposited is introduced into a surface of a material at a specific angle, whereby a thin film is formed. The thin film comprises columnar crystal particles, which are oblique to the support material. Specifically, in a vacuum container, an aromatic polyamide film 2 in a long film form as the support material on which the thin film is vapor-deposited is fed from a supply roll 3, and transported along a surface of a cooling drum 4 rotated. The material to be vapor-deposited in a fixed vapor deposition crucible 5 is irradiated with an electron beam 6B from an electron gun 6 to form a molten bath of the material. Vaporized matters of the material to be vapor-deposited are produced to perform the oblique vapor deposition. Thus, the thin film of the material to be vapor-deposited can be formed on the surface of the long film 2.

In FIG. 1, a shielding plate 9 disposed over the cooling drum 4 is for regulating an incident angle of the material to be vapor-deposited. The shielding plate 9 has an opening so that the vaporized metal is vapor-deposited only on the predetermined portions of the long film 2. The opening has a shutter 10 as shown in FIG. 1. The shutter 10 slides in arrow directions at a beginning and ending of the vapor deposition steps to open and close the opening of the shielding plate 9. The shutter 10 functions to prevent excess vapor deposition.

In the vapor deposition according to the present invention, when the material to be vapor-deposited is molten at the vapor deposition preparation steps, the long film 2 is stood by or moved at a very low speed of 1 m/min or less under the condition that the shielding plate 9 remains closed, that is, the opening of the shielding plate 9 is closed by the shutter 10. Thus, radiant heat accompanied by heating the material to be vapor-deposited can affect the long film 2 at the minimum, and the area of the long film 2 thermally damaged can be decreased, i.e., a loss of the film can be decreased as low as possible. If the long film 2 comprises PET or PEN, and the film is stood by or moved at a very low speed of 1 m/min or less upon melting, the film is significantly thermally damaged, and the film is not well moved, resulting in unstable movement of the film even after the vapor deposition preparation steps are completed. In contrast, according to the present invention, the film is moved under the above-defined conditions in the vapor deposition preparation steps, and the long film 2 comprises the aromatic polyamide having excellent heat resistance, whereby the film is prevented from thermally damaging and perforating, and the vapor deposition can be conducted stably while the film is moved well. Furthermore, although the aromatic polyamide film is inherently easily electrified and adhered to the cooling drum, according to the present invention, the aromatic polyamide film is not adhered by electrification, and there is no breakage of the film, and no unstability in the movement.

After the vapor deposition preparation steps are conducted as described above and it is ready for the vapor deposition, the long film 2 is started to be moved substantially, and the shutter 10 is open. In other words, the shutter 10 may be open after it is confirmed that the long film 2 is substantially moved. Or, the shutter 10 may be open and the film is substantially moved at the same time. The term "substantially moving" herein means that the film is moved at the vapor deposition steps, and is distinguished from the movement at very low speed in the vapor deposition preparation steps. The speed of the film substantially moved is about 50 to 300 m/min.

In the present invention, the above-defined procedures in the vapor deposition preparation steps are important. Other conditions in respect to the vapor deposition may be determined in accordance with the known methods in the art as required, and are not limited thereto. The vapor deposition method of the present invention is especially suitable for forming a magnetic layer on a non-magnetic substrate, i.e., the long film 2, in vacuum when producing a magnetic recording medium.

The material for vapor depositing the magnetic layer is preferably a ferromagnetic metal material. Non-limiting examples of such ferromagnetic metal material include single or mixed metal of Fe, Co, Ni, and the like, or a three component system such as Co—Ni—Cr, Fe—Ni—N, Co—Ni—Ta, and the like. In the oblique vapor deposition method, it is preferable that the vacuum container in which the non-magnetic substrate 2 can be moved be evacuated to $10^{-3}$ Pa, and then the material to be vapor-deposited be heated, molten, and vapor-deposited using the electron beam of the electron gun 6.

Upon the vapor deposition, oxidation gas may be introduced for protecting the surface and controlling magnetic properties. The oxidation gas to be introduced can be selected suitably from oxygen, ozone, nitrous oxide, and the like. A gas supplying nozzle (not shown) for introducing the gas into the vapor deposition part may be disposed between the shielding plate 9 and the shutter 10, both of which are shown in FIG. 1.

The vapor deposition method of the present invention is applicable to form a single magnetic layer, or multiple, i.e., two or more, magnetic layers. It is preferable that the magnetic layer have a total thickness within the range of 10 to 500 nm. If the thickness of the magnetic layer is less than 10 nm, still durability becomes unstable. On the other hand, if the thickness of the magnetic layer exceeds 500 nm, a thickness loss is increased to deteriorate electromagnetic conversion properties. In the oblique vapor deposition according to the present invention, the cooling drum may be rotated in a forward or backward direction, and may be designed in a non-limiting manner as long as the required electromagnetic conversion properties are satisfied.

In the shown apparatus, an irradiation position of the electron beam 6B into the crucible 5 can be confirmed by an inspection hole for monitoring the electron beam comprising a light shielding shutter device 11 disposed on a side wall of the vacuum container. An evacuator 8 is disposed to keep the vacuum container at the predetermined pressure.

The following examples are given for the purpose of illustration of this invention and are not intended as limitation thereof.

EXAMPLE 1

A magnetic layer was formed by vapor-depositing Co as the material to be vapor-deposited contained in the vapor deposition crucible 5 onto an aramide film having a thickness of 4.0 μm ("Mictron 4MA30" manufactured by Toray Industries, Inc.) as the polymer support film (base film) 2 using the oblique vapor deposition apparatus 1 shown in FIG. 1 in a vacuum of $1\times10^3$ Pa.

Upon the vapor deposition, the material to be vapor-deposited, Co, was molten, while the shutter 10 was closed and the base film 2 was stood by holding at the cooling drum 4. Upon heating and melting the material to be vapor-deposited, an emission current of the electron beam was gradually increased until it reached the intended film thickness. Once the material to be vapor-deposited is completely molten, the base film 2 was started to be moved. At the same time, the shutter 10 was open to start the vapor deposition. The movement of the film was accelerated to the predetermined speed. Table 1 shows a status of the film movement at the time, and a loss length of the film until it reached the intended film thickness of 100 nm. The film thickness was measured by measuring light transmittance on-line.

EXAMPLE 2

The vapor deposition was conducted as the same manner as in Example 1 except that once the material to be vapor-deposited was completely molten, the emission current of the electron beam was decreased to a half value that in Example 1, the film was then started to be moved, and at the same time, the shutter 10 was open to increase the value of the emission current to the same value in Example 1 during acceleration. Table 1 shows a status of the film movement at the time, and a loss length of the film until it reached the intended film thickness.

EXAMPLE 3

The vapor deposition was conducted as the same manner as in Example 1 except that once the material to be vapor-deposited was completely molten, the emission current of the electron beam was decreased to a half value that in Example 1, the film was then started to be moved and accelerated, and immediately after the acceleration was confirmed, the shutter 10 was open. Table 1 shows a status of the film movement at the time, and a loss length of the film until it reached the intended film thickness.

EXAMPLE 4

The vapor deposition was conducted as the same manner as in Example 1 except the film was moved at a speed of 1 m/min when the material to be vapor-deposited was molten, the film was moved and accelerated after the material to be vapor-deposited was completely molten, and at the same time, the shutter 10 was open. Table 1 shows a status of the film movement at the time, and a loss length of the film until it reached the intended film thickness.

EXAMPLE 5

The vapor deposition was conducted as the same manner as in Example 4 except that once the material to be vapor-deposited was completely molten, the emission current of the electron beam was decreased to a half value that in Example 4, the film was then started to be moved, and at the same time, the shutter 10 was open to increase the value of the emission current to the same value in Example 4 during acceleration. Table 1 shows a status of the film movement at the time, and a loss length of the film until it reached the intended film thickness.

EXAMPLE 6

The vapor deposition was conducted as the same manner as in Example 4 except that once the material to be vapor-deposited was completely molten, the emission current of the electron beam was decreased to a half value that In Example 4, the film was then started to be moved and accelerated, and immediately after the acceleration was confirmed, the shutter 10 was open to increase the value of the emission current to the same value in Example 4 during acceleration. Table 1 shows a status of the film movement at the time, and a loss length of the film until it reached the intended film thickness.

Comparative Example 1

As in Example 1, when the material to be vapor-deposited was molten, the film was tried to be moved at a speed of 10 m/min, but at this time the film was broken.

Comparative Example 2

As in Example 1, when the material to be vapor-deposited was molten, the film was tried to be moved at a speed of 5 m/min, but the film moved in a zigzag direction, and was broken.

Comparative Example 3

The vapor deposition was conducted as the same manner as in Example 1 except that a PET film having a thickness of 6.5 μm was used as the polymer support film 2, the film was moved at a speed of 10 m/min when the material to be vapor-deposited was molten, the movement of the film was accelerated after the material to be vapor-deposited was completely molten, and at the same time, the shutter 10 was open. Table 1 shows a status of the film movement at the time, and a loss length of the film until it reached the intended film thickness.

Comparative Example 4

The vapor deposition was conducted as the same manner as in Example 1 except that a PET film having a thickness of 6.5 μm was used as the polymer support film 2. Table 1 shows a status of the film movement at the time, and a loss length of the film until it reached the intended film thickness.

Comparative Example 5

The vapor deposition was conducted as the same manner as in Example 1 except that a PEN film having a thickness of 4.7 μm was used as the polymer support film 2, the film was moved at a speed of 10 m/min when the material to be vapor-deposited was molten, the movement of the film was accelerated after the material to be vapor-deposited was completely molten, and at the same time, the shutter 10 was open. Table 1 shows a status of the film movement at the time, and a loss length of the film until it reached the intended film thickness.

Comparative Example 6

The vapor deposition was conducted as the same manner as in Example 1 except that a PEN film having a thickness of 4.7 μm was used as the polymer support film 2. Table 1 shows a status of the film movement at the time, and a loss length of the film until it reached the intended film thickness.

TABLE 1

| | Film material | Moving speed of the material to be vapor-deposited upon melting (m/min) | Movement status | Loss length (m) |
| --- | --- | --- | --- | --- |
| Example 1 | Aramide | 0 | A little movement wrinkle | 80 |
| Example 2 | Aramide | 0 | A little movement wrinkle | 94 |
| Example 3 | Aramide | 0 | No problem | 93 |
| Example 4 | Aramide | 1 | No problem | 115 |
| Example 5 | Aramide | 1 | No problem | 121 |
| Example 6 | Aramide | 1 | No problem | 126 |
| Comparative Example 1 | Aramide | 10 | Film broken | — |
| Comparative Example 2 | Aramide | 5 | Zigzag movement, film broken | — |
| Comparative Example 3 | PET | 10 | No problem | 312 |

TABLE 1-continued

| | Film material | Moving speed of the material to be vapor-deposited upon melting (m/min) | Movement status | Loss length (m) |
|---|---|---|---|---|
| Comparative Example 4 | PET | 0 | Thermally damaged, perforated | — |
| Comparative Example 5 | PEN | 10 | No problem | 336 |
| Comparative Example 6 | PEN | 0 | Thermally damaged, perforated | — |

As described above, according to the present invention, there can be provided the vapor deposition method using the long aromatic polyamide film such that the film is not thermally damaged or broken accompanied by the molten of the material to be vapor-deposited, and a loss of the film can be decreased as compared with the conventional method, whereby the film can be moved and vapor-deposited stably.

What is claimed is:

1. A method of vapor depositing a thin film on a long film comprising aromatic polyamide in vacuum, comprising:

standing by or moving the long film at a speed of 1 m/min or less while a material to be vapor-deposited is molten under the condition that a shielding plate between the material to be vapor-deposited and the long film is closed, starting a movement of the long film at a speed of 50 to 300 m/min after the melting of the material to be vapor-deposited is substantially completed, and at the same time as said starting movement at a speed of 50 to 300 m/min or thereafter opening the shielding plate.

2. The method according to claim 1, wherein the material to be vapor-deposited is a ferromagnetic metal material.

3. The method according to claim 2, wherein an electron beam is used for melting the material to be vapor-deposited.

4. The method according to claim 2, wherein said ferromagnetic metal material is selected from the group consisting of Fe, Co, Ni, Co—Ni—Cr, Fe—Ni—N, Co—Ni—Ta and mixtures thereof.

5. The method according to claim 1, wherein an electron beam is used for melting the material to be vapor-deposited.

6. The method according to claim 1, wherein said thin film has a thickness of 10 to 500 nm.

7. The method according to claim 1, said thin film comprises a single magnetic layer or multiple magnetic layers.

8. The method according to claim 1, further comprising introducing an oxidation gas.

9. The method according to claim 8, wherein said oxidation gas is selected from the group consisting of oxygen, ozone, nitrous oxide and mixtures thereof.

* * * * *